United States Patent [19]

Havranek et al.

[11] Patent Number: 4,733,720
[45] Date of Patent: Mar. 29, 1988

[54] WATER COOLING MEANS FOR INSERTABLE COMPONENT PARTS GROUPS IN DEVICES OF POWER ELECTRONICS

[75] Inventors: Gustav Havranek, Purkersdorf; Helmut Rumpler, Sieding, both of Austria

[73] Assignee: Siemens Aktiengesellschaft, Berlin and Munich, Fed. Rep. of Germany

[21] Appl. No.: 9,500

[22] Filed: Feb. 2, 1987

[30] Foreign Application Priority Data

Feb. 28, 1986 [AT] Austria .................................. 518/86

[51] Int. Cl.$^4$ .............................................. F28F 7/00
[52] U.S. Cl. .................................... 165/80.4; 165/86; 361/385
[58] Field of Search ...................... 165/80.4, 80.5, 86; 361/385

[56] References Cited

U.S. PATENT DOCUMENTS

| | | | |
|---|---|---|---|
| 4,196,775 | 4/1980 | Groh | 165/68 |
| 4,235,283 | 11/1980 | Gupta | 165/80.4 |
| 4,274,476 | 6/1981 | Garrett | 165/80.4 |
| 4,381,032 | 4/1983 | Cutchaw | 165/80.4 X |
| 4,646,202 | 2/1987 | Hook et al. | 165/80.4 X |
| 4,649,990 | 3/1987 | Kurihara et al. | 165/80.4 |

FOREIGN PATENT DOCUMENTS 0145212 6/1985 European Pat. Off. .

*Primary Examiner*—Albert W. Davis, Jr.
*Assistant Examiner*—Richard R. Cole
*Attorney, Agent, or Firm*—Hill, Van Santen, Steadman & Simpson

[57] ABSTRACT

In a water cooling arrangement for insertable component parts groups in devices of power electronics, the carrier element on which the component parts are arranged is fashioned as a component parts carrier independent of the cooling member. A water-traversed cooling member which is seated essentially apparatus-rigid can be individually brought into thermal interaction with every component parts carrier inserted into the device in the composite of an insert being brought into thermal interaction therewith by the force of resilient elements at heat transmission surfaces precisely mating to one another which are fashioned at component parts carriers and cooling members. With a mechanical device all cooling members can be distanced in common from the apertaining component parts carriers opposite the acting direction of the forces of the resilient elements. A replacement of component parts carriers is thereby enabled without performing manipulations at devices of the cooling water circulation.

5 Claims, 2 Drawing Figures

WATER COOLING MEANS FOR INSERTABLE COMPONENT PARTS GROUPS IN DEVICES OF POWER ELECTRONICS

BACKGROUND OF THE INVENTION

1. Field of the Invention

The subject matter of the invention is a water cooling means for insertable component parts groups in devices of power electronics based on the principle wherein the stray heat from the component parts flows off directly into the cooling water via a layer of metal having good thermal conductivity fashioned as a carrier element required for separating the component parts from the cooling water flowing through the cooling member.

2. Description of the Prior Art

An air-water heat exchanger system is nearly indispensible in all devices in which greater heat quantities are to be dissipated. Given a favorable price, water as the cooling agent has a relatively constant, low temperature and is usually unproblematically available. These facts as well as the high thermal value lead to a very high efficiency given low mechanical outlay, whereby the heat exchanger system can be operated nearly maintenance free.

Water-cooled units in devices of power electronics are constructed upon employment of commercially available elements usually manufactured of aluminum extruded sections which are preferably connected to the cooling water circulation by means of flexible pressure tubing. These comprise water-floodable channels or chambers as well as a preferably planarily designed outside surface particularly carrying the electrical component parts having high stray heat.

Greater numbers of such units, preferably with parallel connection of the electrical component parts groups are arranged in large devices, for example computer tomographs, nuclear magnetic resonance tomographs, etc. A unique problem which shall be disclosed below derives given such devices. The reliability of the devices is of great significance for the operation of such installations. As a consequence of the costs of acquisition, only one such device is usually present. An outage of the system thus means an interruption or cessation of all diagnostics for some time. Since diagnosis departments having such apparatus have waiting lists, a complete re-scheduling of the planned examinations is required, so that, for example, ambulatory patients cannot be examined must be called in again. When the system is down, the fault locating must lead to a successful conclusion as quickly as possible. It is obvious and known to utilize computers as auxiliary means for this purpose. Errors which have occurred can be automatically registered so that the service technician can quickly identify the cause. A prerequisite for quick fault elimination is realized by the employment of assemblies that can be interchanged in case of disruption and by good accessibility. The time required for repair could thus be reduced to a minimum. However, a significant complication and delay occurs due to the water cooling means. In order to replace a malfunctioning assembly, namely, the cooling water connection must be dismantled after the cooling water has been drained out. The risk of damage to the devices due to flow-out of residual water thereby always exists. After a new assembly has been integrated, the cooling water connection thereof must be carefully restored and the cooling water must be re-introduced.

SUMMARY OF THE INVENTION

An object of the invention is to create a new device wherein the replacement of the water-cooled component parts carrier can be accomplished significantly faster and simpler. This object is achieved by having the carrier element on which the component parts are arranged, fashioned as a component parts carrier independent of the cooling member. Also, a water-permeated cooling member, essentially seated apparatus-rigid on resilient elements, can be individually brought into direct, pressure-superficial thermal interaction with each component parts carrier inserted into the device individually or in plurality in the composite of an insert. The cooling member can be brought into interaction in the operational final position by the force of the resilient elements, at heat transmission surfaces exactly mated to one another and fashioned at component parts carriers and cooling members. All cooling members may be displaceable in common against the acting direction of the forces of the resilient elements by a device acting on them in identical fashion and, thus, being spaceable from the apertaining component parts carriers.

The advantage of the device of the invention is that, without limiting the functionability, a significant shortening or reduction of the work time required for the replacement of inserts or component parts carriers, and thus of the down time of the apparatus, can be achieved since any and all manipulations at devices of the cooling water circulation can be avoided on the basis of the principle of the invention. For this reason, damage to the apparatus due to residual water flowing out can likewise be avoided.

An advantageous embodiment of the device of the invention is that coil springs are provided as the resilient elements, these coil springs being introduced between the cooling members and cooling member carrying plates arranged parallel to the insertion direction of the inserts in the housing. For the common displacement of the cooling members opposite the effective force of the coil springs required for the common distancing of the cooling members from the apertaining component parts carriers, two shafts for each row of cooling members arranged parallel to the direction of this row and having an essentially hemispherical cross section are provided. These shafts are seated on the cooling member carrier plate and are rotatable in opposite directions, whereby webs are arranged at opposite sides of the cooling members, the shafts acting on these webs when turned as a consequence of the diameter discontinuity of their cross section.

The advantages of these measures are that, even given a plurality of component parts carriers arranged on an insert, static ambiguity is avoided for their allocated cooling member or members even though the pressurized interactive connection to the component parts carriers is simultaneously produced for all. Further, ideal drive elements are created in the form of the shafts, since they excellently correspond to the given space conditions, and the common drive member for the shafts can be concentrated at one of their ends. Also, all of the reaction force of the resilient elements is transmitted into the cooling member carrier plate via the bearings of the shafts and the drive member is thus free of reaction forces in both final positions. Finally, due to the opposite rotation of the shafts at the cooling member, no disturbing, resultant force occurs perpendicular to the desired direction of the movement.

An advantageous development of the drive elements is that the shafts comprise crank arms at identical ends. These crank arms are connected in articulated fashion to thrust rods and, via these thrust rods, are connected to a drive member. Given devices comprising a plurality of stories of inserts, the drive elements for the cooling members apertaining to further stories can be connected to the thrust rods in the same way.

It is advantageous here that these drive elements for the shafts can be arranged entirely flat in practically one plane which can be placed extremely close to one side wall of the housing, whereby these drive elements do not move out of this plane even during their function. A drive arrangement which makes practically no claims of the usually tight interior space of the device is thus created. This is also true for the extremely simple expansion for the incorporation of further insertion stories.

An exemplary embodiment of a water cooling device of the invention shall be set forth in greater detail below with reference to the drawings.

DESCRIPTION OF THE PREFERRED EMBODIMENTS

Figure 1:
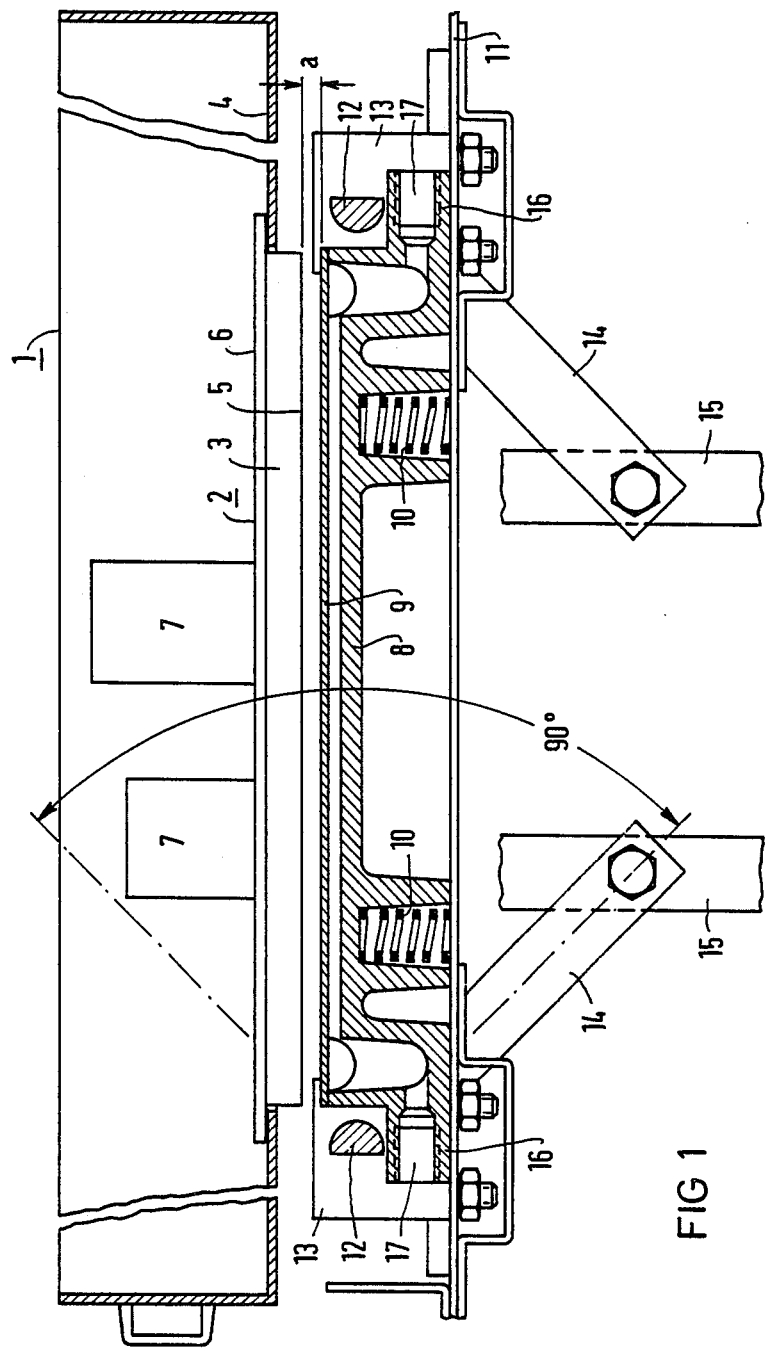
FIG. 1 is a longitudinal section through a water cooling device for a component parts carrier disengaged from thermal interaction.
Figure 2:
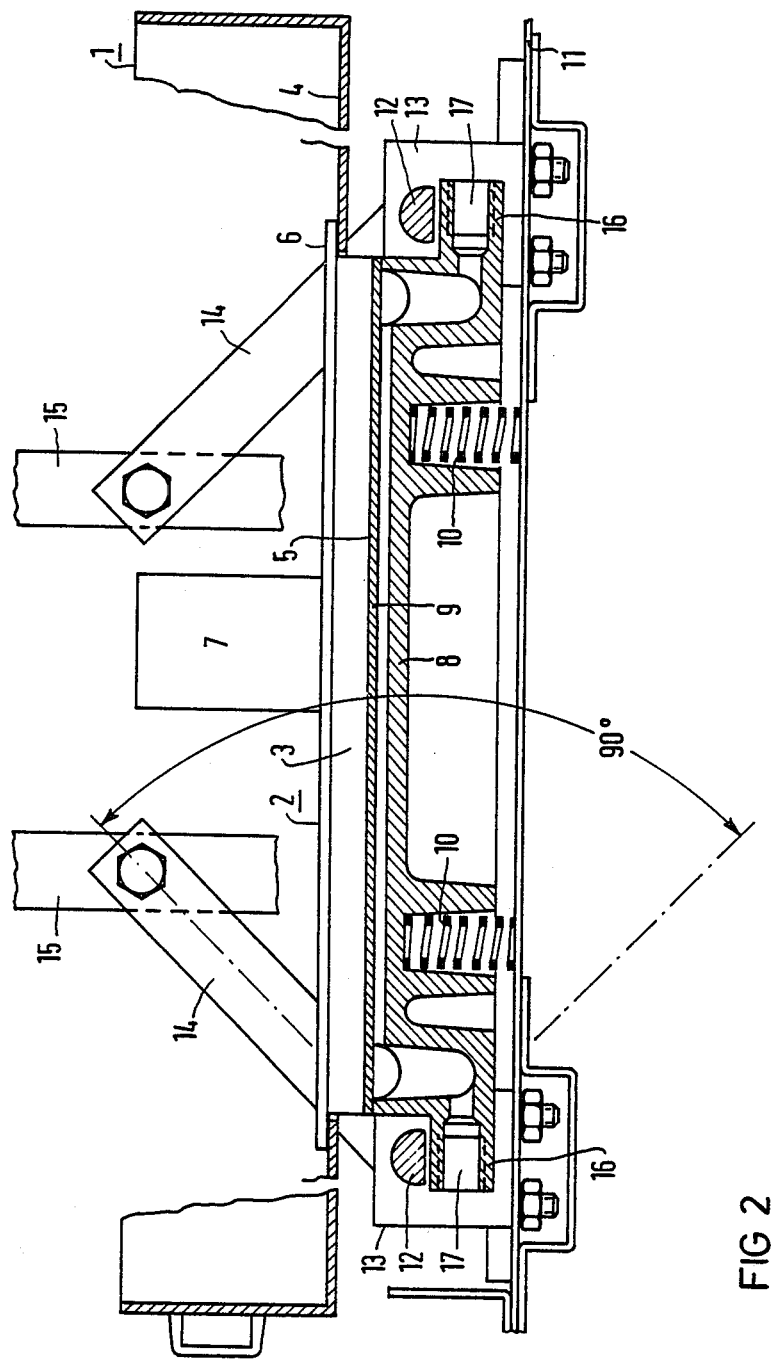
FIG. 2 is a longitudinal section through a water cooling device for a component parts carrier engaged for thermal interaction.

The inserts 1 are constructed in essentially the shape of drawers and can be introduced into the device cabinet in horizontal direction in a plurality of stories. Copper plates 3 as component parts carriers 2 are arranged horizontally in recesses of the floor 4 of the insert 1, being arranged in a row proceeding perpendicular to the insertion direction such that their under surfaces 5 project slightly downward out of the bottom surface of the floor 4. As indicated here, the electrical component parts 7, particularly the component parts having high production of stray heat are secured to the upper surfaces 6 of the component parts carrier 2 with good thermal contact. The lower surfaces 5 should be advantageously produced with very little surface roughness. They are provided, namely, as heat transmission surfaces 5 to water-flooded cooling members 8 on which heat transmission surfaces 9 exactly mating to these heat transmission surfaces 5 of the component parts carriers 2 are fashioned. These cooling members 8 are arranged on cooling member carrier plates 11 horizontally secured in the apparatus cabinet, being arranged thereon with slight, vertical displacability indicated at a, but essentially apparatus-rigid, and being positioned such that the heat transmission surface 5 of every component parts carrier 2 inserted into its operational file position resides exactly opposite a heat transmission surface 9 of an apertaining cooling member 8.

In the operating condition of the apparatus, the cooling members 8 are pressed against the inserted component parts carriers 2 by the coil springs 10, so that the direct, thermal interaction between component parts carrier 2 and cooling member 8 is produced by the heat transmission surfaces 5, 9 exactly mating to one another. In order to release the pressurized, surface contact for the purpose of unimpeded removal of the inserts 1 from the apparatus, all cooling members 8 are pushed back in common and simultaneously against the force of the coil springs 10 and are thus distanced or spaced from the apertaining component parts carrier 2. The latter can therefore be pulled from the apparatus, for example, in a direction proceeding parallel to their heat transmission surface 5 which is the provided, horizontal insertion direction.

Provided for this common locking of the cooling members 8 for each row of cooling members 8 are two shafts 12 arranged parallel to the direction of this row, these shafts 12 having an essentially hemispherical cross section and being double or multiply seated on the cooling member carrier plate 11 by means of bearing blocks 13. Both shafts 12 include short crank arms 14 at identical ends which are connected to thrust rods 15 in articulated fashion. The analogously executed devices of other insertion stories can be connected to these thrust rods 15. By actuating the thrust rods 15, both shafts 12 of every insertion story can be rotated by about 90° in opposite directions. The diameter discontinuity of their cross-sectional surface thereby acts on webs 16 like an eccentric or a cam, these webs 16 being arranged at opposite sides of every cooling member 8, acting on them in the sense of a desired displacement of the cooling member 8. The connecting threads 17 for the flexible pressure tubing (not shown here) serving for the admission and discharge of the cooling water can be advantageously situated in these webs 16.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. In a water cooling means for insertable component parts groups in devices of heat generating power electronics wherein water is used as a coolant to remove excess generated heat, the water being separated from the electronics parts by a metallic carrier element, the improvement comprising:
    fashioning a carrier element independently from a cooling member;
    said cooling member being water permeated and being mounted on resilient elements to be urged into thermal transfer contact with said carrier element;
    said cooling member and said carrier element having heat transmission surfaces precisely matable with one another; and
    said cooling member being displaceable by a device acting thereon opposite to a force of said resilient elements, thereby permitting said cooling member to be selectively spaced from said carrier element.

2. A water cooling device according to claim 1, wherein a plurality of carrier elements are engagable by a plurality of cooling members, and all of said cooling members being displaceable by a single device acting opposite to said force of said resilient members.

3. A water cooling means for insertable component parts groups in devices of power electronics based on the principle wherein the stray heat essentially flows from the component parts directly into the cooling water via a layer of metal having good thermal conductivity fashioned as a carrier element which is necessary for separating the component parts from the cooling water flowing through the cooling members, comprising the improvement wherein the carrier element on which the component parts are arranged is fashioned as a component parts carrier independent of the cooling member; in that a respective, water-permeated cooling member seated on resilient elements essentially apparatus-rigid can be individually brought into immediate, pressurized-planar thermal interaction with every component parts carrier inserted individually or in plurality into the apparatus in the composite of an insert, being brought into this thermal interaction therewith in the operational final position thereof at heat transmission surfaces precisely mating with one another which are fashioned at component parts carriers and cooling members; and in that all cooling members are displaceable in common by a device acting on them in identical fashion opposite the acting direction of the forces of the resilient elements and being thus spaceable from the apertaining component parts carriers.

4. A water cooling means according to claim 3, wherein coil springs are provided as said resilient elements, these coil springs being inserted between the cooling members and cooling member carrier plates arranged parallel to the insertion direction of the inserts in the housing; and in that two shafts having an essentially hemispherical cross section are provided for each row of cooling members arranged parallel to the direction of this row, being provided for the common displacement of the cooling members against the effective force of the coil springs necessary for the common distancing of the cooling members from the apertaining component parts carriers, said shafts being seated on the cooling member carrier plate and being rotatable opposite to one another, whereby webs on which the shafts act upon rotation as a consequence of the diameter discontinuity of their cross section are arranged at opposite sides of the cooling members.

5. A water cooling means according to claim 4, wherein the shafts include crank arms at identical ends; wherein these crank arms are connected to thrust rods in articulated fashion and are connected to a drive member via said thrust rods and wherein given devices comprising a plurality of stories of inserts, the drive elements for the cooling members apertaining to further stories can be connected to the thrust rods in the same fashion.

* * * * *